United States Patent [19]
Gove et al.

[11] Patent Number: 5,582,669
[45] Date of Patent: Dec. 10, 1996

[54] METHOD FOR PROVIDING A PROTECTIVE OVERCOAT ON AN IMAGE CARRYING MEDIUM UTILIZING A HEATED ROLLER AND A COOLED ROLLER

[75] Inventors: Maurice A. Gove, Framingham, Mass.; Keith D. Joncas, Londonderry, N.H.; Alfredo G. Kniazzeh, West Newton; John B. Morse, Boston, both of Mass.

[73] Assignee: Polaroid Corporation, Cambridge, Mass.

[21] Appl. No.: 240,854

[22] Filed: May 10, 1994

[51] Int. Cl.$^6$ ........................................ B32B 31/20
[52] U.S. Cl. .................. 156/239; 156/230; 156/247; 156/555; 156/282; 156/344; 156/584; 355/285; 355/295; 430/99; 430/124
[58] Field of Search ........................ 156/230, 239, 156/240, 247, 277, 300, 358, 555, 582, 324, 282, 344, 584; 355/285, 295; 430/99, 124, 126

[56] References Cited

U.S. PATENT DOCUMENTS

| | | | |
|---|---|---|---|
| 3,038,833 | 6/1962 | Glover | 156/324 X |
| 3,388,019 | 6/1968 | Thigpen | 156/282 |
| 3,840,420 | 10/1974 | Sarcia | 156/358 X |
| 3,929,545 | 12/1975 | Van Dyck et al. | 156/230 X |
| 3,967,997 | 7/1976 | Masters | 156/201 |
| 3,973,328 | 8/1976 | Theobald | 34/4 |
| 3,994,146 | 11/1976 | Murase | 101/470 |
| 4,069,081 | 1/1978 | Drower et al. | 156/272 |
| 4,076,570 | 2/1978 | Meoley et al. | 156/244 X |
| 4,142,301 | 3/1979 | Goodall | 34/18 |
| 4,287,285 | 9/1981 | Mosehauer | 430/124 X |
| 4,464,220 | 8/1984 | Beer | 156/273.3 |
| 4,555,436 | 11/1985 | Geurtsen et al. | 428/200 X |
| 4,735,854 | 4/1988 | Lauchenauer | 428/347 X |
| 5,021,318 | 6/1991 | Mayo et al. | 430/124 X |
| 5,076,976 | 12/1991 | Aoki et al. | 264/22 |
| 5,083,152 | 1/1992 | Tokuda | 355/27 |
| 5,126,797 | 8/1992 | Forest et al. | 355/278 X |
| 5,155,003 | 10/1992 | Chang | 430/200 |
| 5,155,536 | 10/1992 | Johnson et al. | 355/290 X |
| 5,200,297 | 4/1993 | Kelly | 430/255 |
| 5,339,146 | 8/1994 | Aslam et al. | 355/285 X |
| 5,354,597 | 10/1994 | Capik et al. | 428/152 |

FOREIGN PATENT DOCUMENTS

| | | |
|---|---|---|
| 2028719 | 3/1980 | United Kingdom . |
| 8804237 | 6/1988 | WIPO . |
| 9209930 | 6/1992 | WIPO . |

Primary Examiner—David A. Simmons
Assistant Examiner—Steven J. Helmer
Attorney, Agent, or Firm—Robert A. Sabourin

[57] ABSTRACT

A method and apparatus for laminating a protective overcoat carried on a web to an image carrying medium is particularly useful for covering an image carrying medium having a large area. A hot roller and an actively cooled cold roller form a nip through which the web and image carrying medium advance in a juxtaposed relationship. A temperature differential is created across the layers of the web and medium to promote adhesion between the surface of the protective overcoat and the image while preventing lamination artifacts such as curling and rippling. Postwrap and prewrap angles are used to enhance control of artifacts and assist in post lamination separation of the overcoated image carrying medium from residual web material.

11 Claims, 3 Drawing Sheets

METHOD FOR PROVIDING A PROTECTIVE OVERCOAT ON AN IMAGE CARRYING MEDIUM UTILIZING A HEATED ROLLER AND A COOLED ROLLER

FIELD OF THE INVENTION

In general the present invention relates to laminating systems and methods of lamination, and more particularly, to lamination systems and methods which eliminate or minimize ripple and curl for large area laminations of at least 14 by 17 inches.

BACKGROUND OF THE INVENTION

It is often advantageous to insulate certain types of surfaces against potentially damaging environmental influences and improper handling by overcoating them with a protective layer. In this regard, the application of a protective overcoat onto such a surface by means of lamination has become a favored practice. One surface that benefits from such lamination is an image surface of a thermal imaging medium, such as described in International Patent Application No. PCT/US87/03249 (Publication No. WO 88/04237) (Etzel), the image surface being formed after imagewise formation of the medium's image-forming layer.

More particularly, International Patent Application No. PCT/US87/03249 describes a thermal imaging medium and a process for forming an image in which a layer of a porous or particulate imaging material (preferably, a layer of carbon black) is deposited on a heat-activatable image-forming surface of a first sheet-like element, the layer having an adhesive strength to the first sheet-like element that is a function of its exposed state. Portions of this thermal imaging medium are then exposed to brief and intense radiation (for example, laser scanning), to firmly attach exposed portions of the imaging material to the first sheet-like element. Finally, those portions of the imaging material not exposed to the radiation (and thus not firmly attached to the first sheet-like element) are removed, thereby forming a binary image surface comprising a plurality of first areas where the imaging material is adhered to the first sheet-like element and a plurality of second areas where the first sheet-like element is free from the imaging material.

In an embodiment of the thermal imaging medium described by International Patent Application No. PCT/US87/03249, a first sheet-like element of imaging material is covered with a second sheet-like element that is laminated to the first so that the imaging material is confined between the first element and the second element. After imaging and separation of the second element (with the unexposed portions of the imaging material) from the first element, a pair of image surfaces is obtained. The first image surface comprises exposed portions of image-forming substance more firmly attached to the first element by heat activation of the heat-activatable image-forming surface. The second image surface comprises non-exposed portions of the image-forming substance carried or transferred to the second sheet element. Either of the pair of image surfaces may, for reasons of informational content, aesthetic or otherwise, be considered the principal image surface, and all of the following discussion is applicable to both types of image surface.

While the image-forming process described in International Patent Application No. PCT/US87/03249 is capable of producing high quality, high resolution images, the durability of the image surfaces produced by this process may be inappropriate for certain desired applications. In the finished image surface, the porous or particulate imaging material, typically carbon black admixed with a binder, lies exposed (unprotected). The image may be vulnerable to being smeared, damaged or removed by, for example, fingers or skin surfaces (especially if moist), solvents or friction during manual or other handling of the image.

Given such opportunities for mishandling and the like, it may be desirable to protect the image surface of the developed thermal imaging medium by the application of a protective overcoat, e.g. a thin, transparent, but durable layer and adhesive, such as described in International Patent Application No. PCT/US91/08345 (Publication No. WO 92/09930) (Fehervari et al.); and pending U.S. application Ser. No. 08/065345 (Bloom et al.).

Lamination of protective overcoats, such as those described in the cited patent applications, has been accomplished using a continuous roll, i.e. web, to conduct the durable layer to the image carrying sheets, the durable layer typically being associated with an adhesive layer. Activation energy to fuse the durable layer to the imaged sheet is provided at a nip existing between paired compression rollers. Generally, the top roller is actively heated and the bottom roller (by conduction from the top roller) reaches a steady state temperature well above room temperature. Lamination is effected by the cooperative influences of both compression and thermal heating. While such method has provided good results, rippling and curling of the laminated image sheets is problematic especially for large scale laminations, e.g. 14 by 17 inches more or less.

In light of the above, need exists for a laminating system and method useful for laminating a protective overcoat onto a receiving surface while eliminating or at least minimizing ripple and curl of the laminated sheets, and it is a primary object of the invention to provide a solution to the foregoing problems.

Other objects of the invention will, in part, be obvious and, in part, appear hereinafter when the following detailed description is read in conjunction with the drawings.

SUMMARY OF THE INVENTION

Apparatus and methods are provided for laminating a protective overcoat to a large area surface carrying an image. The apparatus comprises: a hot roller heated by a heating device to a first predetermined temperature sufficient to soften the protective overcoat; and a cold roller cooled by a cooling device to a second predetermined temperature lower than the first predetermined temperature. The cold roller and the hot roller form a nip when in a closed operating position. A feeding device is used for juxtaposing a web and an image carrying medium and guiding the juxtaposed web and image carrying medium through the nip where the cold roller contacts the image carrying medium and the hot roller contacts the web. In this manner, the softened protective overcoat molds onto and adheres to the image carrying medium forming a bonded image carrying medium. A mechanism maintains the bonded image carrying medium in physical contact with the cold roller for a first predetermined distance downstream of the nip, and a strip bar, located downstream of the nip at the first predetermined distance, separates predefined layers of the web from the bonded image carrying medium to form a final protected laminated image carrying medium. The continued physical contact of the bonded image carrying medium along the cold roller helps prevent curl, as well as eliminating or minimizing rippling.

BRIEF DESCRIPTION OF THE DRAWINGS

The aforementioned aspects and other features of the invention are described in detail in conjunction with the accompanying drawings in which the same reference numerals are used throughout for denoting corresponding elements and wherein.

DETAILED DESCRIPTION OF THE PREFERRED EMBODIMENTS

The lamination systems and methods of the present invention are generally directed towards thermally bonding a laminating sheet carried on a web to a substrate. The invention is more particularly directed towards thermally bonding an imagewise protective overcoat to an image carrying medium.

In addition to providing important protection against environmental effects and handling injuries, overcoats may serve also to impart to a receiving surface certain desired aesthetic or decorative effects. For example, in certain applications, it may be desirable to provide a protective overcoat with an imagewise dispersal or pattern of pigments or colorants. Lamination of such a protective overcoat onto a receiving surface provides aesthetic value apart from inherent protective functionality, such as in the lamination of a wood-patterned overcoat onto the surface of, for example, particle board. Several other functions exist and applications in fields other than imaging will generally vary depending upon the nature of the receiving surface and desired effects. Accordingly, the term "protective overcoat" should be given liberal construction.

In a preferred application of the present invention, an adhesive layer, a durable layer, and a discontinuous part of a release layer form the protective overcoat, i.e. a thermal transfer overcoat, which is thermally bonded to a receiving surface of an image carrying medium. Ideally, the release layer would be completely removed from the durable layer, however, in application the release layer does not cleanly separate from the durable layer, so that a portion of the release layer remains attached to the durable layer The lamination of the above layers onto the image carrying medium is effectuated by heating the adhesive layer to its glass transition temperature while simultaneously compressing together the layers with the image carrying medium at a nip between two rollers so that the adhesive layer softens, molds to, and adheres to the image carrying medium. For the present case of laminating layers onto an image carrying medium, each of the layers should be transparent so as not to interfere with viewing of the image.

Figure 1:
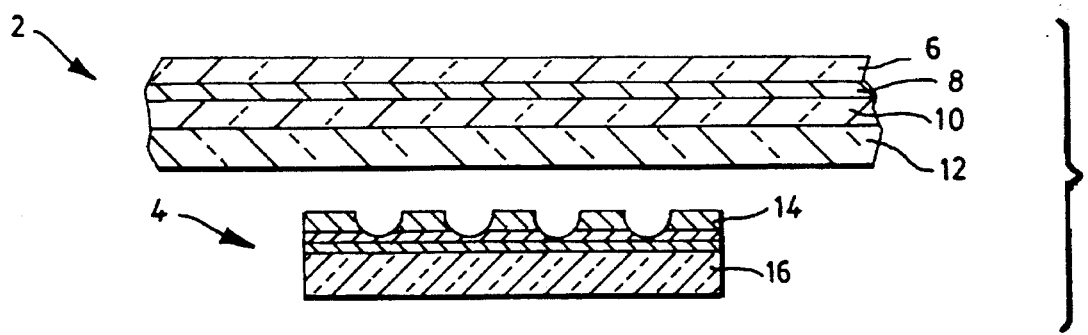
FIG. 1 is a diagrammatic cross-sectional side elevational view of a web and an image carrying medium prior to lamination.

FIG. 1 of the accompanying drawings shows a web 2 disposed over an image carrying medium 4, where the image carrying medium 4 is composed of a binary image surface 14 formed on a substrate 16. In addition to the aforementioned International Patent Application No. PCT/US87/03249 (Etzel), examples and methods of obtaining an image carrying medium 4 may be had from the discussions provided in U.S. Pat. No. 5,155,003, issued to K. C. Chang on Oct. 13, 1992, and U.S. Pat. No. 5,200,297, issued to N. F. Kelly on Apr. 6, 1993. While these examples all relate to imaging media wherein the receiving surfaces are porous or particulate image bearing surfaces developed by laminar separation, use of the present invention is not limited to developed thermal imaging media, but rather, can also be used advantageously for the protection of images prepared by resort to other known imaging methods including, but not limited to, those prepared by thermal dye transfer, ink jet, and laser ablation transfer methods. Even more generally, the present invention may be utilized for the lamination of any surface on which a protective overcoat is thermally transferred.

Web 2 is generally wider than the image carrying medium to ensure complete lamination coverage of the image carrying surface. The web 2 includes an adhesive layer 12, a durable layer 10, a release layer 8, and a support layer 6. The protective overcoat which is to be thermally transferred to the image carrying medium during lamination includes the durable layer 10, the adhesive layer 12 and a part of the release layer 8. The support layer 6 and a portion of the release layer 8 will be separated and removed, following lamination, from the protected laminated image carrying medium.

The durable layer 10 of the web 2 may be formed from any material (such as a cured acrylic polymer or a polymethacrylate) which confers the desired properties for protecting the image. For example, International Patent Application No. PCT/US91/08345 describes an embodiment wherein the durable layer is coated as a discontinuous layer from a latex which clears during lamination to produce a clear durable layer. As described, the durable layer comprised 80% by weight acrylic polymer, 10% by weight polyethylene/paraffin wax, and 10% by weight aqueous-based polyamide binder, and was prepared by mixing the polymer and wax latices, adding the binder, then adding a silicone surfactant.

In general, it is preferred that the durable layer 10, when laminated over the binary image surface 14 of the image carrying medium 4, not have a thickness greater than about 30 µm, since thicker durable layers may, in some cases, cause problems in viewing the image due to optical effects within the durable layer 10. Desirably, the thickness of the durable layer 10 does not exceed 10 µm, and more desirably this thickness is in the range of 1 to 6 µm. The durable layer 10 should of course be abrasive and chemically resistant to materials with which it is likely to come into contact, including the materials which may be used to clean the protected laminated image carrying medium. Although the exact materials which may contact the image will vary with the intended uses of the protected laminated image carrying medium, in general it is desirable that the material for the durable layer 10 should be resistant to and substantially unchanged by any materials with which it may come into contact, such as water, isopropanol and petroleum distillates.

It will be appreciated that the protection of the image carrying medium 4 conferred by the protective overcoat is improved with increased lubricity. Therefore, at least one of a wax, a solid silicone and silicone surfactant is preferably included in the durable layer 10 to increase the lubricity of this layer. Also, if the release layer 8 is composed of a material having high lubricity, then the portion of the release layer which remains adhered to the durable layer 10 after separation of a discard layer 27 (see FIG. 3) will provide improved lubricity of the protective overcoat.

The support layer 6 of the web 2 may be formed from any material (such as polyester) which can withstand the conditions which are required to laminate the protective overcoat to the image carrying medium 4. If desired, the support layer 6 may be treated with a subcoat or other surface treatment as well-known to those skilled in the coating art, to control its surface characteristics, for example, increase or decrease the adhesion of the durable layer 10 to the support layer 6 via the release layer 8.

Figure 3:
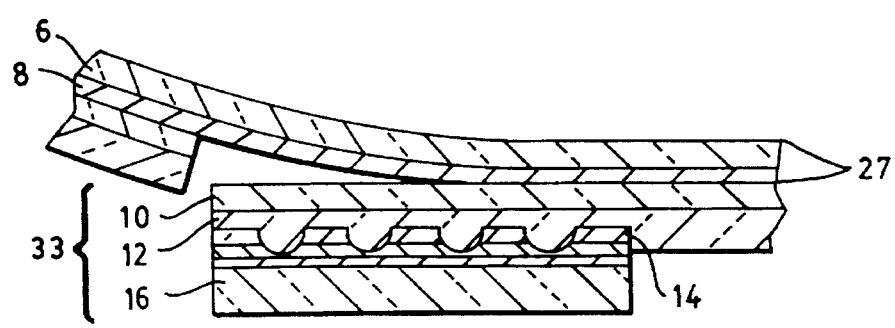
FIG. 3 is a diagrammatic cross-sectional side elevational view of a protective overcoat bonded to an image carrying medium after lamination.

The support layer 6 should be sufficiently coherent and adherent to the durable layer 10 to permit displacement of both the support layer 6 and part of the release layer 8, away from the protected laminated image carrying medium including removal of those portions of the web 2 which extend beyond the periphery of the substrate 16 (see FIG. 3). The release layer 8 breaks unevenly so that part of the release layer 8 having a discontinuous thickness remains with the discard layer 27 and another part of the release layer 8 remains attached to the durable layer 10. The part of the release layer 8 remaining with the durable layer 10 improves the lubricity of the protective overcoat as noted above.

The adhesive layer 12 of the web 2 is disposed on the surface of the durable layer 10 remote from the support layer 6 so that, during lamination, the durable layer 10 is adhered to the binary image surface 14 via the adhesive layer 12. The use of an adhesive layer 12 is desirable to achieve strong adhesion between the durable layer 10 and the image carrying medium 4. Various types of adhesive may be used to form the adhesive layer 12. For example, the adhesive layer 12 might be formed from a thermoplastic adhesive having a glass transition temperature in the range of about 185° F., in which case bondability is effected by the conductive heating of the adhesive layer above its glass transition temperature.

Figure 6:
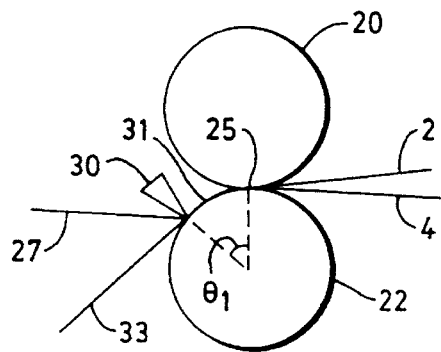
FIG. 6 is a diagrammatic side view of part of the laminating system of FIG. 4 illustrating postwrap of the protected laminated image carrying medium along the bottom roller thereof, which is cold.

In the following examples, the above materials and tolerances of the various layers of the web 2 and the image carrying medium 4 are to be used. The laminating system of FIG. 6 includes the web 2 which is juxtaposed and fed together at a rate of about 0.5 inches per second with the image carrying medium 4 through a compression nip 25 formed between a hot roller 20 which is about 3.5 inches in diameter and is actively heated by a heating device (not shown), and a cold roller 22 which is also approximately 3.5 inches in diameter, and is actively cooled by a cooling device (not shown). The heating device could take the form of an interior resistance cartridge controlled by an external thermistor spaced near the top surface of the hot roller. The hot roller 20 is preferably maintained at a temperature of about 320°±5° F. and the cold roller 22 is preferably maintained at a temperature of about 90° F. or less in order to minimize ripple and curl in the protected laminated image carrying medium. Both the hot roller 20 and the cold roller 22 should be constructed from a conductive material such as aluminum and at least one of the rollers should have a compliant elastomeric layer to evenly distribute a nip pressure of at least about 120 lb/in$^2$. After passing through the nip 25 the bonded web 2 and image carrying medium 4 (designated jointly as the bonded image carrying medium 31) is postwrapped along the cold roller 22 for an arcuate distance defined by the angle $\theta_1$ where $\theta_1$ is ideally about 20 degrees. The postwrapping angle $\theta_1$ is critical for elimination of laminating artifacts (such as longitudinal curl and ripples) in the protected laminated image carrying medium. Curl is defined as any curvature of the protected laminated image carrying medium away from the plane of its major surface area. Curl can occur in either the longitudinal direction which is the direction of feeding of the sheets, or in the transverse direction which is perpendicular to the longitudinal direction. Rippling (which generally occurs in the transverse direction, i.e. the direction perpendicular to the feed direction of the web) is defined as oscillating elevations of the protected laminated image carrying medium above or below the plane of the major surface area of the protected laminated image carrying medium.

If the postwrap angle $\theta_1$ is too small, then neither the longitudinal curl (which is directed away from the cold roller 22) nor the ripples may be completely eliminated. On the other hand, if the postwrap angle $\theta_1$ is too large, then the ripples will be eliminated but longitudinal curl may result in the opposite direction, i.e. in the direction of the cold roller 22. After postwrapping the bonded web and image carrying medium 31 throughout the arcuate distance of $\theta_1$, the discard layer 27, consisting of the support layer 6 and a part of the release layer 8, is separated from the protected laminated image carrying medium 33 by a strip bar 30.

The postwrap angle $\theta_1$ which is required for elimination of both longitudinal curl and rippling will vary according to codependent parameters such as the materials and dimensions of the web 2 and image carrying medium 4, the tension in the web, the temperatures of the hot and cold rollers, the speed of feeding the juxtaposed sheets between the rollers, and the pressure applied to the juxtaposed sheets between the rollers.

Figure 7:
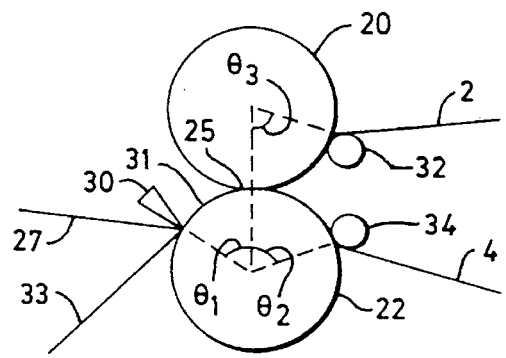
FIG. 7 is a diagrammatic side view of part of the laminating system of FIG. 4 illustrating prewrap of the web along the top roller thereof which is hot, prewrap of the image carrying medium along the cold bottom roller, and postwrap of the bonded image carrying medium along the cold bottom roller.

Another embodiment of a laminating system according to the invention is shown in FIG. 7. The laminating system includes the web 2 which is prewrapped along the hot roller 20 for a predetermined arcuate distance defined by the angle $\theta_3$ in order to facilitate preheating of the web. The prewrap angle $\theta_3$ is critical since too small an angle may result in inadequate softening of the adhesive layer so that sufficient bonding between the adjacent layers may not occur, and too large an angle will result in degradation of the adhesive layer 12 and the durable layer 10. The image carrying medium 4 is prewrapped along the cold roller 22 for a predetermined arcuate distance defined by a non-critical angle $\theta_2$ (which can vary for instance from 0 to 90 degrees) in order to facilitate both (i) the juxtaposition of the web 2 and image carrying medium 4, and (ii) the feeding of the juxtaposed sheets into the nip 25. As in the example of FIG. 6, the bonded image carrying medium 31 remains in contact with the cold roller 22 for the predetermined arcuate distance defined by $\theta_1$ until the discard layer 27 is separated, forming the protected laminated image carrying medium 33.

Figure 2:
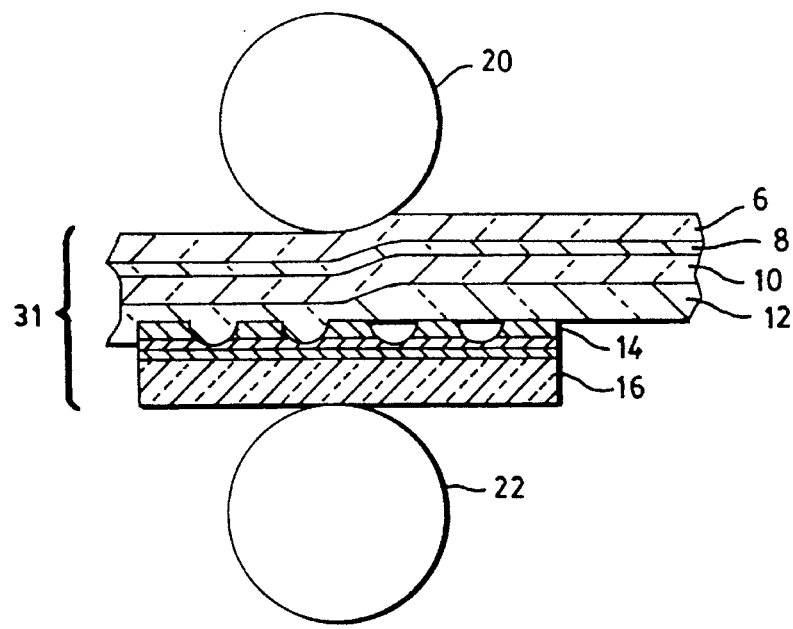
FIG. 2 is a diagrammatic cross-sectional side elevational view of the web and the image carrying medium of FIG. 1 during lamination.
Figure 8:
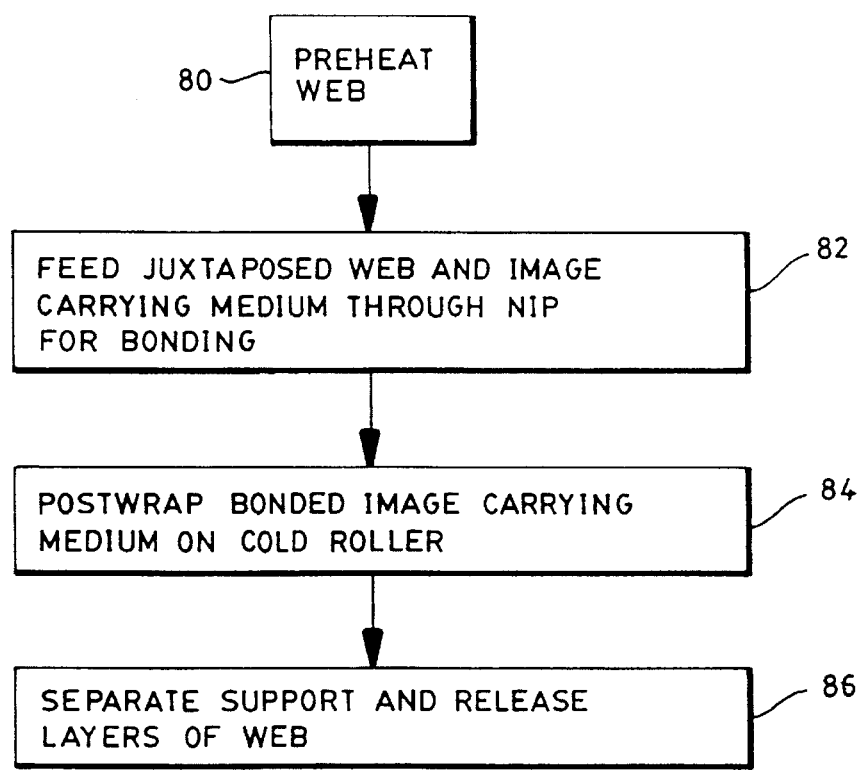
FIG. 8 is a flow diagram of the steps of a preferred embodiment of the inventive method.

A preferred method of laminating a protective overcoat onto an image carrying medium is outlined by the flowchart of FIG. 8. In block 80 the web 2 is preheated by bringing it into contact with the hot roller 20 (also referred to as the heated roller 20) for the predetermined arcuate distance defined by angle $\theta_3$ as shown in FIG. 7. Preheating prevents wrinkling of the web 2 and allows the hot roller 20 to operate at a lower temperature. The preheated web 2 and the image carrying medium 4 in block 82 are juxtaposed, fed through the nip 25, and bonded together as shown in FIGS. 2 and 7. Prewrapping the image carrying web 4 along the cold roller 22 (also referred to as the cooled roller 22) is a convenient way to accurately juxtapose, align and feed the image carrying medium 4 and the web 2 into the nip 25 (see FIG. 7).

Any commercially available cooling unit can be used to actively cool the cold roller 22 either internally, such as by circulating cool air or a liquid coolant through the interior of the roller, or externally, such as by fanning cooled air over the cold roller surface. The structure of the cold roller 22 can be designed to maximize the cooling effect of the cooling unit. For instance, a cold roller cooled by air flow could be designed as a hollow roller with internal fins.

As the juxtaposed web 2 and image carrying medium 4 are fed through the nip 25, a bonded image carrying medium 31 is formed due to the adhesive layer 12 softening, molding to, and adhering to the image carrying medium 4 under a compressive force for a time sufficient to promote adhesion.

In step 84, the bonded image carrying medium 31 remains in contact (i.e. is postwrapped) with the cooled roller 22 for the predetermined arcuate distance defined by $\theta_1$. The purpose of the postwrap is fourfold. First, when the web 2 is prewrapped along the hot roller 20 throughout the arcuate distance defined by $\theta_3$, a differential stress is created across its thickness which tends to curl the web 2 towards the hot roller 20. This stress is countered by postwrapping the bonded image carrying medium 31 along the cold roller 22 for the predetermined arcuate distance of $\theta_1$. The second purpose of postwrapping is extracting heat from the bonded image carrying medium 31 along the cold roller 22 to eliminate ripples in the protective overcoat. The third purpose of postwrapping is to prevent thermal expansion from buckling the web 2 and thereby imparting ripples to the web 2. The fourth purpose of postwrapping is to maintain a bond between the web 2 and the cold roller 22 during time in which the web temperature is high enough to otherwise distort the web dimensions, compromising registration quality.

Figure 5:
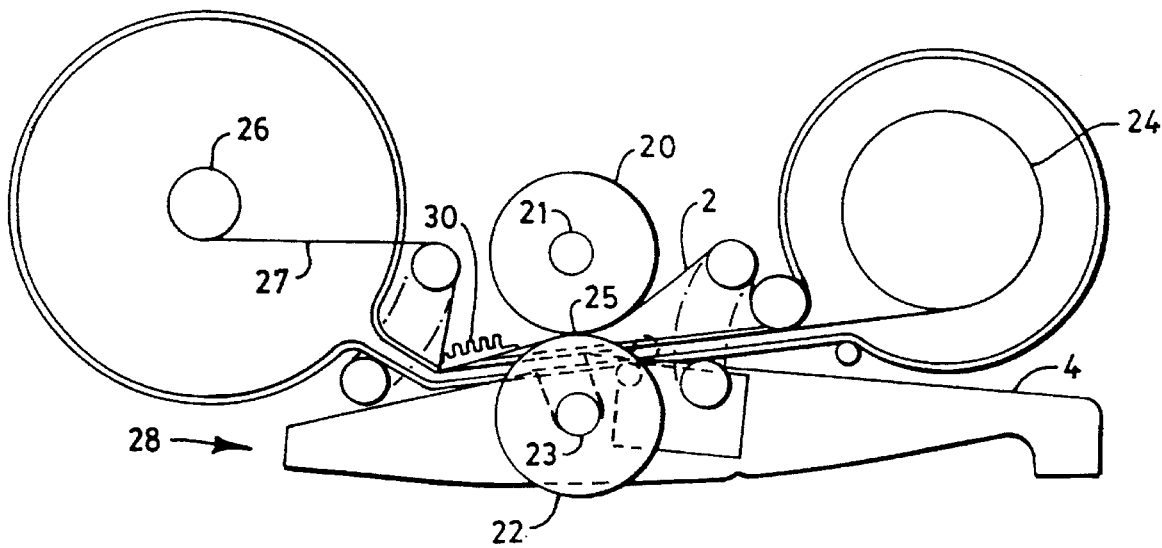
FIG. 5 is a diagrammatic side view of the laminating system of FIG. 4 shown in another mode of operation while lamination is occurring.

After the bonded image carrying medium 31 has travelled the predetermined arcuate distance of $\theta_1$, the discard layer 27 is separated and removed from the bonded image carrying medium 31 in block 86 by a strip bar 30, then wound onto take-up roller 26 (as shown in FIG. 5), resulting in the protected laminated image carrying medium 33 which includes the substrate 16, the binary image layer 1.4, the adhesive layer 12, the durable layer 10 and part of the release layer 8.

Figure 4:
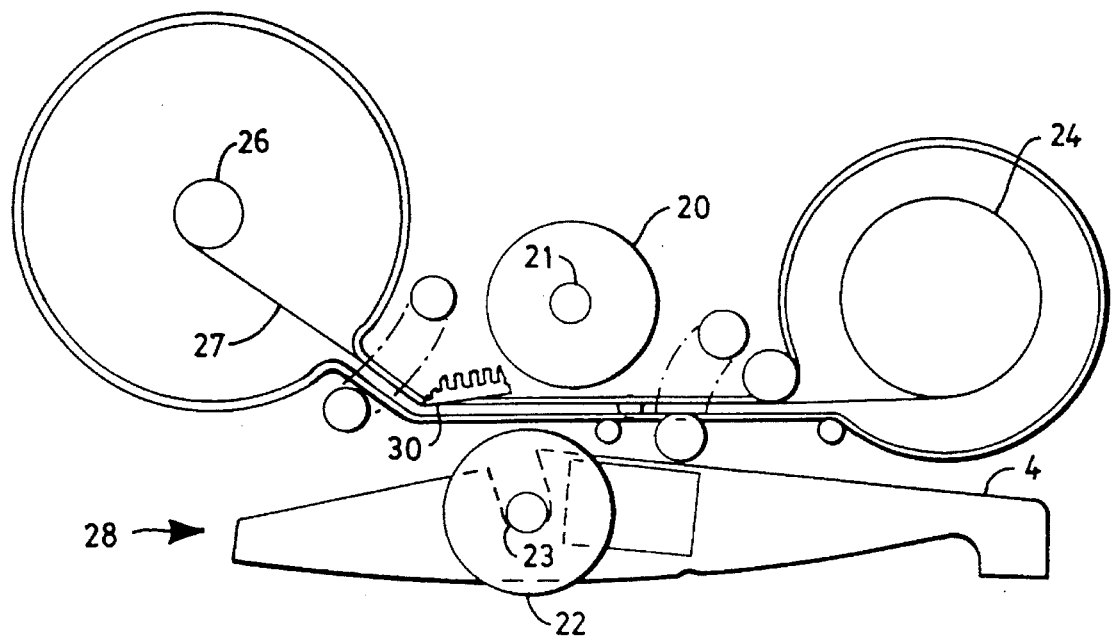
FIG. 4 is a diagrammatic side view of a laminating system according to a preferred embodiment of the invention shown in one mode of operation when lamination is not occurring.

A preferred structure of the inventive laminating system is illustrated in FIGS. 4 and 5 which provides 4 by 17 inch protected laminated image carrying mediums, i.e X-ray images, for medical diagnostics. A continuous 18 inch wide web 2 spans between an idle supply roller 24 and a driven take-up roller 26. The width of the web 2 is set at 18 inches to ensure registration of the web 2 with the 17 inch wide image carrying medium 4. The image carrying medium 4 is typically supplied as a 17 by 14 inch sheet from a keeper tray 29. The system also includes a driven heated roller 20, an idling cooled roller 22, a strip bar 30, and a lower assembly 28 composed of the cooled roller 22 and the keeper tray 29. The lower assembly 28 moves to a first position as shown in FIG. 4 when lamination is not occurring. When lamination is occurring, the lower assembly 28 is moved to a second position as shown in FIG. 5. The web 2 is prewrapped for preheating along the hot roller 20, and the image carrying medium 4 is prewrapped along cold roller 22 for juxtaposition with the web 2. The juxtaposed web 2 and image carrying medium 4 is fed into the nip 25 under compression sufficient to promote bonding. During bonding at the nip, heat energy is ideally uniformly transferred from the heated roller 20 to the web 2 at a temperature sufficient to soften the adhesive layer 12, i.e. at the glass transition temperature of the adhesive layer 12. Typically, the juxtaposed web 2 and image carrying medium 4 are uninterruptedly fed through the nip at a constant pre-established rate (such as 0.5 in./sec), where the juxtaposed sheets are heated and compressed so that the web 2 is bonded to the image carrying medium 4.

Downstream of the nip 25, the discard layer 27, composed of the support layer 6 and part of the release layer 8, is separated from the durable layer 10 (see FIG. 3) which remains laminated via adhesive layer 12 to the image carrying medium 4. In the particular embodiment being described, the separation of the discard layer 27 from the bonded image carrying medium 31 is facilitated by a strip bar 30. The temperature of the bonded image carrying medium 31 when peeling off the discard layer 27, and the tension in the web 2 are both critical to prevent fringing when the discard layer 27 is removed from the bonded image carrying medium 31. If the bonded image carrying medium temperature is too high, more fringing will occur. Fringing occurs when a clean break between the protected laminated image carrying medium 33 and the discard layer 27 is not realized, so that pieces or strips of durable layer 10 and adhesive layer 12 remain precariously attached to the edge of the protected laminated image carrying medium 33. Eventually, the pieces of both the durable layer 10 and the adhesive layer 12 will dislodge and pollute the image, causing a visual disturbance.

The discard layer 27 is wound onto take-up roller 26 after separation from the protected laminated image carrying medium 33. Since the discard layer 27 is thinner and accordingly more flexible than the protected laminated image carrying medium 33, the sharp bending of the discard layer 27 at the strip bar 30 causes it to mechanically peel away from the protected laminated image carrying medium 33, resulting in the finished product (i.e. the protected laminated image carrying medium 33) which is composed of the polyester substrate 16, the binary image surface 14, and the protective overcoat which incorporates the adhesive layer 12, the durable layer 10 and part of the release layer 8.

The above described embodiments of the invention are preferred examples of the many variations and modifications which would be apparent to one of ordinary skill in the art in keeping with the invention as claimed and taught.

What is claimed is:

1. A process of laminating a protective overcoat layer carried by a web onto an image carrying medium, said process comprising the steps of:

juxtaposing said protective overcoat layer and said image carrying medium;

actively heating a hot roller to a first predetermined temperature sufficient to soften said protective overcoat layer;

actively cooling a cold roller to a second predetermined temperature lower than the first predetermined temperature;

forming a nip between said hot and cold rollers by compressing together said hot and cold rollers with a force sufficient to promote adhesion between said softened protective overcoat layer and said image carrying medium; and bonding together said juxtaposed protective overcoat layer and image carrying medium to form a bonded image carrying medium substantially free from ripple and curl by feeding said juxtaposed protective overcoat layer and image carrying medium through said nip, said web contacting said hot roller at said nip and said image carrying medium contacting said cold roller at said nip, and by extracting heat from said bonded image carrying medium by continued contact, for a first predetermined distance corresponding to a predetermined postwrap angle $\theta_1$, of said bonded image carrying medium with said cold roller after passage through the nip.

2. The process of claim 1, further comprising the step of preheating said web by prewrapping, for a second predetermined distance, said web along said hot roller upstream of the nip.

3. The process of claim 2, further comprising the steps of
providing said web comprising a support layer, a release layer, a durable layer and an adhesive layer;
providing said protective overcoat comprising said adhesive layer, said durable layer and a part of said release layer;
providing said image carrying medium comprising a binary image surface and a substrate; and
providing said adhesive layer and said binary image surface in contact therebetween during said juxtaposing step, said support layer contacting said hot roller at the nip, said substrate contacting said cold roller at the nip,
wherein said bonding step further comprises bonding together said juxtaposed protective overcoat layer and said image carrying medium to form said bonded image carrying medium substantially free from ripple and curl when said adhesive layer reaches a glass transition temperature due to thermal transfer from the hot roller.

4. The process of claim 3, further comprising the step of moving a lower assembly to a first position located so that said hot roller and said cold roller are separated when bonding is not occurring and moving the lower assembly to a second position located so that said hot roller and said cold roller form said nip when bonding is occurring, said lower assembly comprising said cold roller and a keeper tray for holding said image carrying medium prior to said juxtaposing step.

5. The process of claim 3, wherein said bonding step further comprises:
feeding said juxtaposed protective overcoat layer and image carrying medium at a rate of about 0.5 inches per second; and
exerting a substantially uniform pressure of at least about 120 lb/in$^2$ between said hot roller and said cold roller, each roller having a diameter of about 3.5 inches.

6. The process of claim 3, further comprising the step of separating, at said first predetermined distance downstream of the nip, said support layer and a part of said release layer from said bonded image carrying medium, forming a protected laminated image carrying medium substantially free from ripple and curl.

7. The process of claim 1, wherein the cooling step further comprises blowing cool air through a hollow, internally finned said cold roller.

8. The process of claim 1, wherein said first predetermined temperature is about 320°±5° F. and said second predetermined temperature is about 90° F. or less.

9. The process of claim 1, wherein said predetermined postwrap angle $\theta_1$ is about 20 degrees.

10. A process for protecting a binary image mounted on a substrate, said binary image comprising a plurality of first areas at which a porous or particulate imaging material is adhered to a substrate and a plurality of second areas at which said substrate is free from said imaging material, said process comprising the steps of:
providing an image carrying medium comprising the binary image and the substrate;
providing a web comprising a support layer, a release layer in contact with said support layer, a durable layer in contact with said release layer and an adhesive layer;
providing a nip by moving a cold roller actively cooled by a cooling device into compressive contact with a hot roller actively heated by a heating device for a first predetermined period of time;
heating said web by prewrapping said web along said hot roller for a first predetermined distance upstream of said nip, said support layer contacting said hot roller;
juxtaposing said heated web and said image carrying medium so that said adhesive layer of said heated web faces said binary image of said image carrying medium;
bonding said heated web and said image carrying medium to form a bonded image carrying medium by feeding said juxtaposed web and image carrying medium through said nip, said substrate contacting said cold roller at said nip;
providing said bonded image carrying medium substantially free from ripple and curl by extracting heat from said bonded image carrying medium while maintaining physical contact of said bonded image carrying medium with said cold roller for a second predetermined period of time following said bonding step; and
separating said support layer and said release layer from said bonded image carrying medium, after said second predetermined period of time, to form a protected image carrying medium substantially free from ripple and curl.

11. The process of claim 10, wherein said cold roller is actively cooled to about 90° F. or less and said hot roller is actively heated to about 320°±5° F.

* * * * *